United States Patent
Shin

(10) Patent No.: US 9,502,432 B1
(45) Date of Patent: Nov. 22, 2016

(54) SEMICONDUCTOR DEVICE COMPRISING A SLIT INSULATING LAYER CONFIGURED TO PASS THROUGH A STACKED STRUCTURE

(71) Applicant: SK hynix Inc., Icheon-si Gyeonggi-do (KR)

(72) Inventor: Wan Cheul Shin, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/996,450

(22) Filed: Jan. 15, 2016

(30) Foreign Application Priority Data

Aug. 20, 2015 (KR) .......................... 10-2015-0117511

(51) Int. Cl.
| | | |
|---|---|---|
| H01L 27/00 | (2006.01) | |
| H01L 27/115 | (2006.01) | |
| H01L 29/06 | (2006.01) | |
| H01L 21/8234 | (2006.01) | |
| H01L 45/00 | (2006.01) | |

(52) U.S. Cl.
CPC . *H01L 27/11582* (2013.01); *H01L 21/823481* (2013.01); *H01L 27/1157* (2013.01); *H01L 27/11556* (2013.01); *H01L 27/11578* (2013.01); *H01L 29/0649* (2013.01); *H01L 45/1233* (2013.01)

(58) Field of Classification Search
CPC .................. H01L 27/11582; H01L 27/11578; H01L 45/1233; H01L 27/1157
See application file for complete search history.

(56) References Cited

U.S. PATENT DOCUMENTS

| | | | | |
|---|---|---|---|---|
| 8,963,115 | B2 * | 2/2015 | Murooka | H01L 45/04 257/2 |
| 9,000,504 | B2 * | 4/2015 | Hattori | H01L 27/1157 257/225 |
| 9,412,752 | B1 * | 8/2016 | Yeh | H01L 27/11565 |
| 2009/0230449 | A1 * | 9/2009 | Sakaguchi | H01L 27/0688 257/298 |
| 2012/0091518 | A1 * | 4/2012 | Sukekawa | H01L 27/10855 257/296 |
| 2013/0059422 | A1 * | 3/2013 | Lee | H01L 21/764 438/268 |
| 2013/0082331 | A1 * | 4/2013 | Fukuda | H01L 29/7833 257/368 |
| 2014/0054534 | A1 * | 2/2014 | Pellizzer | H01L 45/06 257/4 |
| 2015/0147860 | A1 * | 5/2015 | Kim | H01L 29/66795 438/283 |
| 2016/0071870 | A1 * | 3/2016 | Minami | H01L 27/11582 257/314 |
| 2016/0104801 | A1 * | 4/2016 | Zhu | H01L 29/66795 365/185.25 |
| 2016/0163637 | A1 * | 6/2016 | Jung | H01L 27/108 257/776 |

FOREIGN PATENT DOCUMENTS

| | | |
|---|---|---|
| KR | 1020120126031 A | 11/2012 |
| KR | 1020130005430 A | 1/2013 |

* cited by examiner

*Primary Examiner* — Ngan Ngo
(74) *Attorney, Agent, or Firm* — William Park & Associates Ltd.

(57) ABSTRACT

The semiconductor device may include a substrate including a trench. The semiconductor device may include an isolation layer formed in the trench and including an etch stop pattern. The semiconductor device may include a stacked structure disposed over the substrate. The semiconductor device may include a slit insulating layer passing through the stacked structure and including a first region extending in a first direction and a second region extending in a second direction intersecting with the first direction. An intersection region between the first region and the second region may pass through a portion of the isolation layer and come into contact with the etch stop pattern.

11 Claims, 13 Drawing Sheets

SEMICONDUCTOR DEVICE COMPRISING A SLIT INSULATING LAYER CONFIGURED TO PASS THROUGH A STACKED STRUCTURE

CROSS-REFERENCE TO RELATED APPLICATION

The present application claims priority to Korean patent application number 10-2015-0117511 filed on Aug. 20, 2015, the entire disclosure of which is incorporated herein by reference.

BACKGROUND

1. Technical Field

Various embodiments of the present disclosure generally relate to semiconductor devices and methods of manufacturing the same, and more particularly to a semiconductor device having a three-dimensional structure and a method of manufacturing the semiconductor device.

2. Related Art

Nonvolatile memory devices are memory devices that retain stored data even when power supply thereto is interrupted. Recently, as a two-dimensional nonvolatile memory device in which a single-layer memory cell is formed on a silicon substrate has reached a limit in terms of integration density, a three-dimensional nonvolatile memory device in which memory cells are vertically stacked on a silicon substrate has been proposed.

Three-dimensional nonvolatile memory devices include a stacked structure that forms stacked memory cells by alternately stacking conductive layers and insulating layers. However, the process of forming the stacked structure with a high width-to-height ratio has a high level of difficulty. Bridges, which are undesired electrical connections between two or more stacked conductive layers, may lead to a yield drop in the fabrication of semiconductor devices and the degradation of electrical characteristics of semiconductor devices.

DETAILED DESCRIPTION

Figure 1A:
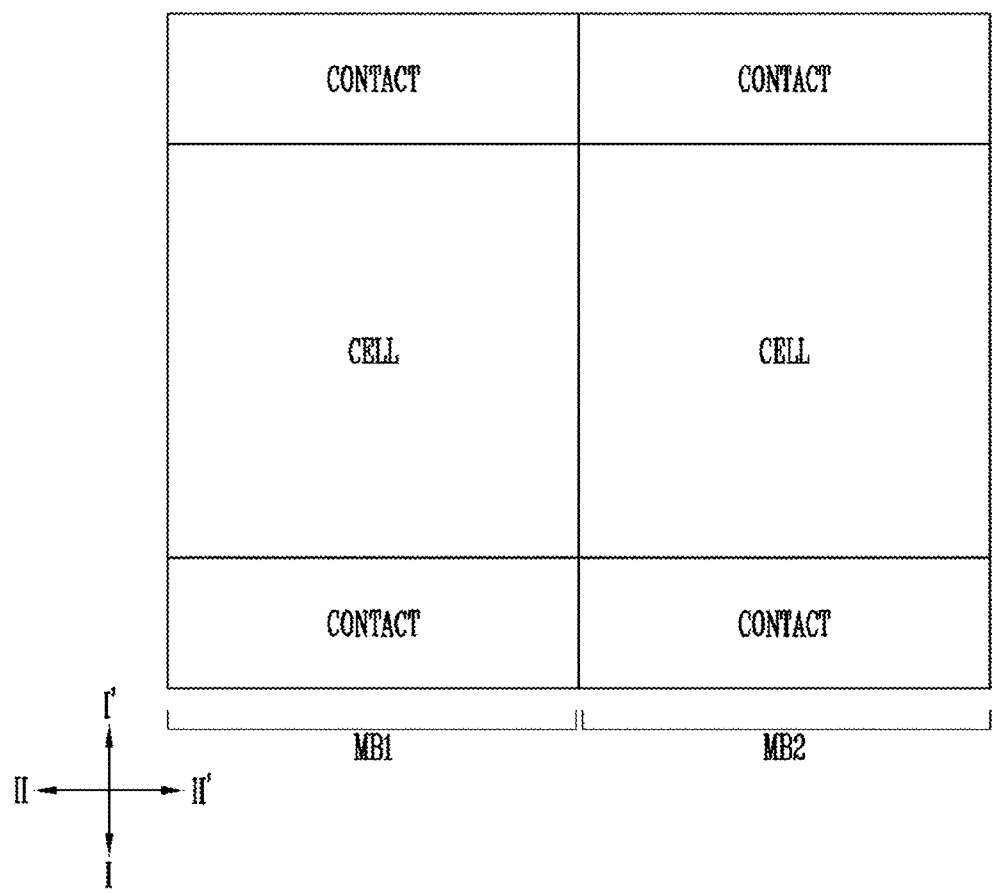
FIGS. 1A to 1D are views illustrating a configuration example of a representation of a semiconductor device according to an embodiment of the present disclosure.

Hereinafter, various examples of embodiments of the present disclosure will be described with reference to the accompanying drawings. In the drawing figures, dimensions may be exaggerated for clarity of illustration. It will be understood that when an element is referred to as being "between" two elements, it can be the only element between the two elements, or one or more intervening elements may also be present. In the following description, redundant descriptions and detailed descriptions of known functions and elements that may unnecessarily make the gist of the present disclosure obscure will be omitted. Reference should now be made to the drawings, in which the same reference numerals are used throughout the different drawings to designate the same or similar components.

Various examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art. In an example of an embodiment, a semiconductor device may include a stable structure and may be capable of facilitating a manufacturing process thereof, and a method of manufacturing the semiconductor device may be provided as well.

In an embodiment of the present disclosure, a semiconductor device may include a substrate including a trench. The semiconductor device may include an isolation layer formed in the trench and including an etch stop pattern therein. The semiconductor device may include a stacked structure disposed over the substrate. The semiconductor device may include a slit insulating layer configured to pass through the stacked structure and including a first region extending in a first direction, and a second region extending in a second direction intersecting with the first direction, wherein an intersection region between the first region and the second region passes through a portion of the isolation layer and comes into contact with the etch stop pattern.

In an embodiment of the present disclosure, a semiconductor device may include a substrate. The semiconductor device may include an isolation layer formed in the substrate and including an etch stop pattern. The semiconductor device may include gate electrodes stacked on the substrate. The semiconductor device may include a first slit insulating layer passing through the gate electrodes. The semiconductor device may include a second slit insulting layer passing through the gate electrodes and intersecting with the first slit insulating layer on the isolation layer.

In an embodiment of the present disclosure, a method of manufacturing a semiconductor device may include forming a trench in a substrate. The method of manufacturing a semiconductor device may include forming an isolation layer in the trench, the isolation layer including an etch stop pattern. The method of manufacturing a semiconductor device may include forming a stacked structure on the substrate. The method of manufacturing a semiconductor device may include forming a first slit insulating layer passing through the stack. The method of manufacturing a semiconductor device may include forming a second slit insulting layer passing through the stacked structure and intersect with the first slit insulting layer, the second slit insulting layer passing through a portion of the isolation layer in a region of intersection with the first slit insulting layer and come into contact with the etch stop pattern.

Figure 1B:
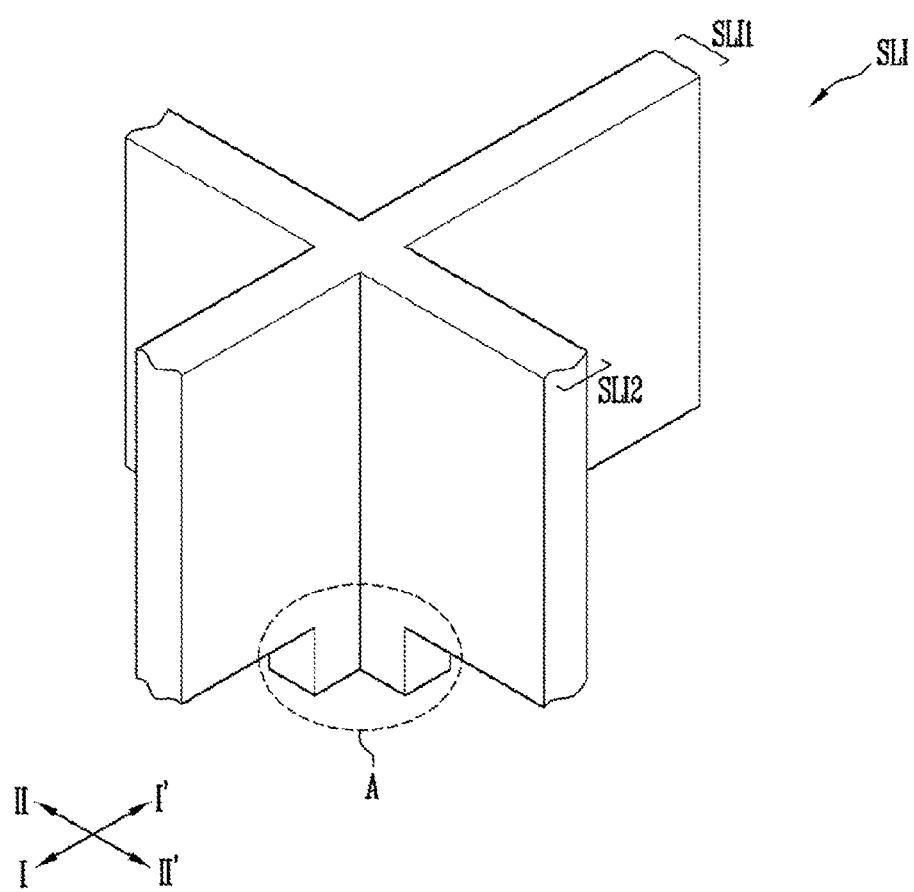
Figure 1C:
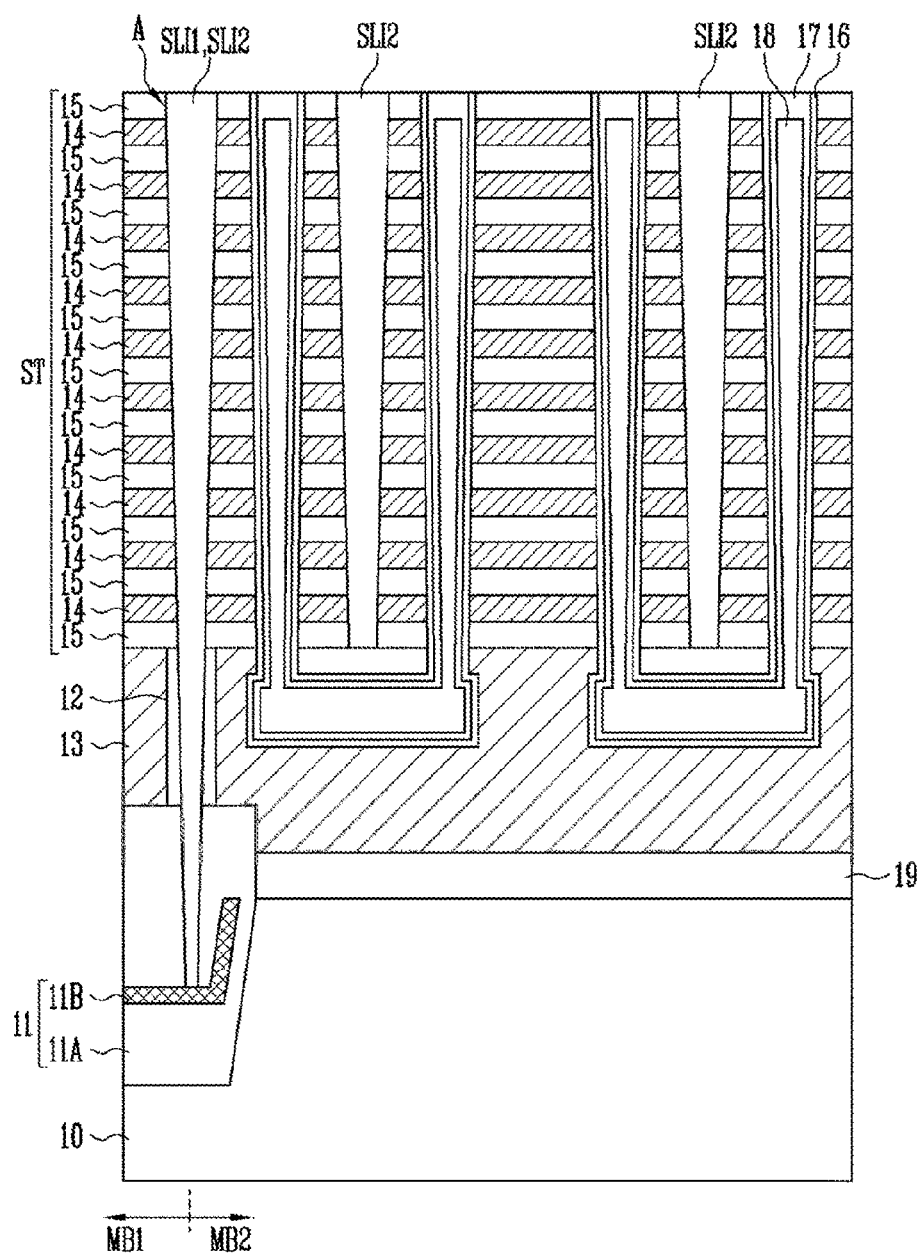
Figure 1D:
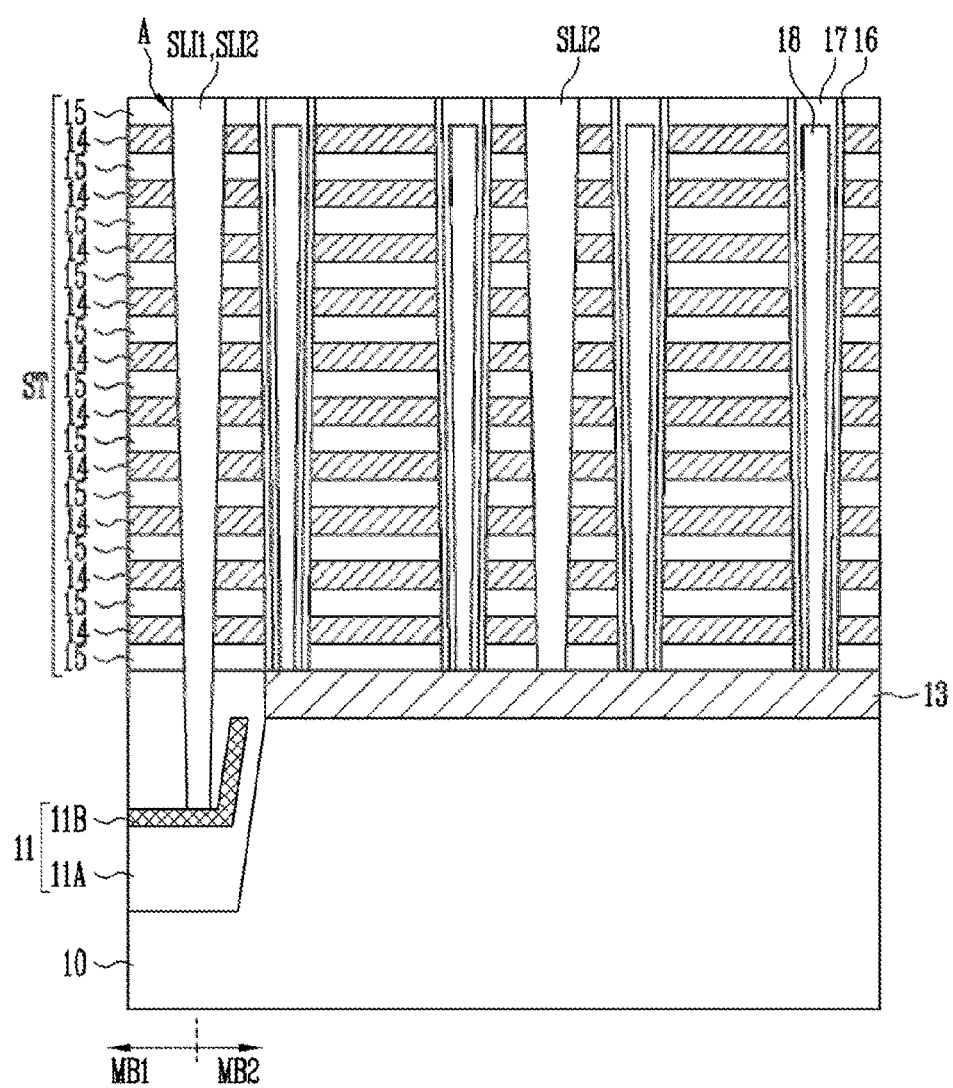

FIGS. 1A to 1D are views illustrating a configuration example of a representation of a semiconductor device according to an embodiment of the present disclosure. FIG. 1A is a layout of the semiconductor device, FIG. 1B is a perspective view illustrating a structure of an isolation layer, and FIGS. 1C and 1D are sectional views of a cell region of FIG. 1A.

Referring to FIG. 1A, the semiconductor device according to an embodiment of the present disclosure includes cell regions CELL and contact regions CONTACT. In the cell regions CELL, stacked memory cells are disposed. In the contact regions CONTACT, interconnection structures such as contact plugs and wires for applying an operating voltage to the stacked memory cells are disposed. Contact regions CONTACT may be disposed on opposite sides of each cell region CELL. Alternatively, each contact region CONTACT may be disposed on only one side of the corresponding cell region CELL. As a further alternative, contact regions CONTACT may be disposed on both sides of the cell region CELL.

Stacked structures formed by alternately stacking gate electrodes and insulating layers are disposed in the cell regions CELL and the contact regions CONTACT. The stacked structure of each contact region CONTACT may be patterned in a stepped form such that the gate electrodes of all layers can be exposed. Here, an exposed region of each gate electrode may become a pad. A contact plug may be coupled to the pad.

Furthermore, the semiconductor device includes a plurality of memory blocks MB1 and MB2. The memory blocks MB1 and MB2 may perform, among other things, an erase operation. During the erase operation, data of the memory cells of the corresponding memory block MB1 or MB2 is removed. For reference, each of the memory blocks MB1 and MB2 includes a plurality of pages and may perform program and read operations in units of pages.

The semiconductor device according to an embodiment of the present disclosure includes stacked structures disposed in the respective memory blocks MB1 and MB2. In an embodiment, a first stacked structure disposed in the first memory block MB1 is separated from a second stacked structure disposed in the second memory block MB2. For example, to separate the first stacked structure and the second stacked structure from each other, a first slit insulating layer (not shown) may be disposed between the first and second stacked structures. Here, the first slit insulating layer can separate the gate electrodes of adjacent memory blocks from each other.

Furthermore, a second slit insulating layer (not shown) may be disposed in each of the stacked structures. The second slit insulating layer may separate the gate electrodes of the memory cells included in each memory block from each other. Some second slit insulating layers may be insulating layers that are formed for the sake of processing convenience. For example, in the case where a memory string is formed in a U-shaped form, the second slit insulating layer may be formed to separate a source side gate electrode and a drain side gate electrode from each other. Alternatively, the second slit insulating layer may be formed in a second slit. Here, the second slit may be a passage that enables stacked sacrificial layers to be replaced with stacked gate electrodes. Here, the second slit insulating layer may be disposed in the cell region CELL.

FIG. 1B is a perspective view illustrating the structure of the isolation layer according to an embodiment of the present disclosure. Referring to FIG. 1B, the isolation layer SLI may include two intersecting lines. For example, the isolation layer SLI may include a first slit insulating layer SLI1 extending in a first direction I-I', and a second slit insulating layer SLI2 extending in a second direction II-II'. The first slit insulating layer SLI and the second slit insulating layer SLI2 may intersect with each other in the cell region CELL on a boundary between the adjacent memory blocks MB1 and MB2 or on a boundary between the cell region CELL and the contact region CONTACT.

Furthermore, an intersection region A in which the first slit insulation layer SLI1 and the second slit insulation layer SLI2 intersect with each other may extend to a depth greater than that of the other regions. For instance, in the case where the first slit insulating layer SLI1 is formed before the second slit insulating layer SLI2 is formed, two etching processes are performed for the intersection region A, and thus the intersection region A has a depth greater than that of the other regions for which a single etching process is performed.

FIG. 1C is a sectional view illustrating a structure of a cell array of the semiconductor device according to an embodiment of the present disclosure and showing a cross section of the cell region of FIG. 1A. In particular, an embodiment will be explained for the case where the memory string is formed in a U-shaped form.

Referring to FIG. 1C, the semiconductor device according to an embodiment includes a substrate 10, an isolation layer 11 formed in the substrate 10, a stacked structure ST, and slit insulating layers SLI1 and SLI2 passing through the stacked structure ST. The semiconductor device may further include a first insulating layer 19 and a first conductive layer 13 which are interposed between the substrate 10 and the stacked structure ST, and semiconductor patterns 17 which have U shapes and memory layers 16.

The isolation layer 11 includes an insulating layer 11A and an etch stop pattern 11B which is formed in the insulating layer 11A. The insulating layer 11A may be made of a material or a composite material including one or more of oxide, polysilazane (PSZ), and tetraethyl orthosilicate (TEOS). The etch stop pattern 11B may include a material having a high etch selectivity with respect to the insulating layer 11A. For example, the etch stop pattern 11B may include a nitride, or metal such as tungsten (W), titanium (Ti), and tantalum (Ta).

The etch stop pattern 11B is disposed in the insulating layer 11A without making contact with neighboring layers such as the first conductive layer 13 and the substrate 10. In other words, the etch stop pattern 11B is not electrically connected to the neighboring layers such as the first conductive layer 13 and the substrate 10 and is in a floating state.

The stacked structure ST includes second conductive layers 14 and second insulating layers 15 which are alternately stacked on top of one another. The second conductive layers 14 may be gate electrodes of stacked memory cells or selection transistors. The second conductive layers 14 may be made of a material or a composite material including one or more of tungsten W, tungsten nitride WNx, titanium nitride TiN, and tantalum nitride TaN. For example, at least one uppermost second conductive layer 14 may be a gate electrode of a selection transistor, and the other second conductive layers 14 may be the gate electrodes of the memory cells. The second insulating layers 15 function to insulate the stacked gate electrodes and may include oxide. The second conductive layers 14 and the second insulating layers 15 may have the same thickness. Alternatively, the second conductive layers 14 and the second insulating layers 15 may have different thicknesses from one another. At least one uppermost second conductive layer 14 may have a thickness greater than that of each of the other second conductive layers 14.

The first conductive layer 13 may be a gate electrode of a pipe transistor and include polysilicon. An isolation pattern 12 may be disposed in a boundary between the adjacent memory blocks MB1 and MB2 so as to separate first conductive layers 13 from each other in units of the memory blocks MB1 and MB2. As such, since the pipe gate electrodes of the memory blocks MB1 and MB2 are separated from each other, the pipe gate electrodes can be controlled on a per-block basis, and thus the pipe gate electrode of the memory block MB1 may be controlled independently from the memory block MB2.

The semiconductor pattern 17 may include vertical patterns which vertically pass through the stacked structure ST, and a horizontal pattern which couples at least two vertical patterns to each other and is disposed in the first conductive layer 13. For example, the vertical patterns may be channel layers of the memory cells, the selection transistors, etc., and the horizontal pattern may be a channel layer of the pipe transistor. Furthermore, one of the vertical patterns coupled to the horizontal pattern may be a source side channel layer, and the other vertical pattern may be a drain side channel layer. The semiconductor pattern 17 may be formed to have a completely filled center, a center filled with a gap filling insulating layer 18, or a combination thereof.

Each of the memory layers 16 may include at least one of a tunnel insulating layer, a data storage layer, and a charge blocking layer, which surround the pillars. The data storage layer may be made of a material or a composite material including one or more of silicon, nitride, phase-change material, and nanodots.

The first slit insulating layer SLI1 may be disposed in the boundary between the adjacent memory blocks and pass through the stacked structure ST. The second slit insulating layer SLI2 may be disposed between the vertical patterns connected to each other by one horizontal pattern and pass through the stacked structure ST. The second slit insulating layer SLI2 may function to separate the source side gate electrode and the drain side gate electrode from each other.

The isolation layer 11 is disposed below the intersection region A at which the first slit insulating layer SLI1 and the second slit insulating layer SLI2 intersect with each other. Therefore, in the intersection region A, the first slit insulating layer SLI1 and the second slit insulating layer SLI2 may pass through the stacked structure ST and the first conductive layer 13 and extend to the isolation layer 11. Here, the first and second slit insulation layers SLI1 and SLI2 may pass through a portion of the isolation layer 11. The first and second slit insulation layers SLI1 and SLI2 may extend up to a predetermined depth and come into contact with the etch stop pattern 11B. For example, the first and second slit insulating layers SLI1 and SLI2 pass through an upper portion of the isolation layer 11 and come into contact with an upper surface of the etch stop pattern 11B without passing through a lower portion of the isolation layer 11. Thus, the first and second slit insulating layers SLI1 and SLI2 do not come into contact with the substrate 10.

According to the configuration described above, at least one source selection transistor, a plurality of source side memory cells, at least one pipe transistor, a plurality of drain side memory cells, and at least one drain selection transistor form one memory string. The memory string is formed in a U-shaped form.

Furthermore, because the isolation layer 11 includes the etch stop pattern 11B, the intersection region A of the first and second slit insulating layers SLI1 and SLI2 can be prevented from extending to the substrate 10.

FIG. 1D is a sectional view illustrating a structure a cell array of the semiconductor device according to an embodiment of the present disclosure and showing a cross section of the cell region of FIG. 1A. In particular, an embodiment will be explained for the case where the memory string extends in a direction perpendicular to the substrate.

Referring to FIG. 1D, the semiconductor device according to an embodiment includes a substrate 10, an isolation layer 11 formed in the substrate 10, a stacked structure ST, and slit insulating layers SLI1 and SLI2 passing through the stacked structure ST. The semiconductor device may further a first conductive layer 13, semiconductor patterns 17, and memory layers 16.

The stacked structure ST includes second conductive layers 14 and second insulating layers 15 which are alternately stacked on top of one another. At least one uppermost second conductive layer 14 may be a gate electrode of an upper selection transistor. At least one lowermost second conductive layer 14 may be a gate electrode of a lower selection transistor. The other second conductive layers 14 may be gate electrodes of memory cells.

The first conductive layer 13 is interposed between the substrate 10 and the stacked structure ST such that the semiconductor patterns 17 come into contact with the first conductive layer 13. The first conductive layer 13 may be a source layer. The source layer may be a conductive layer formed over the substrate 10. The source layer may be made of a material or a composite material including one or more of polysilicon and metal. Alternatively, a source region may be formed by injecting impurities into the substrate 10 to a predetermined depth.

The isolation layer 11 may function to separate the first conductive layers 13 of the adjacent memory blocks MB1 and MB2 from each other and include an insulating layer 11A and an etch stop pattern 11B formed in the insulating layer 11A.

The first slit insulating layer SLI1 may be disposed in a boundary between the adjacent memory blocks MB1 and MB2. The second slit insulating layer SLI2 may be disposed between the adjacent semiconductor patterns 17. The isolation layer 11 is disposed below the intersection region A at which the first slit insulating layer SLI1 and the second slit insulating layer SLI2 intersect with each other.

The other detailed structure is similar to that of the embodiment of FIG. 1C; therefore, further explanation is omitted here.

FIGS. 2A to 2K are sectional views illustrating a representation of an example of a method of manufacturing the semiconductor device according to an embodiment of the present disclosure and illustrating a cross section of an intersection region at which the first slit insulating layer and the second slit insulating layer intersect with each other.

Figure 2A:
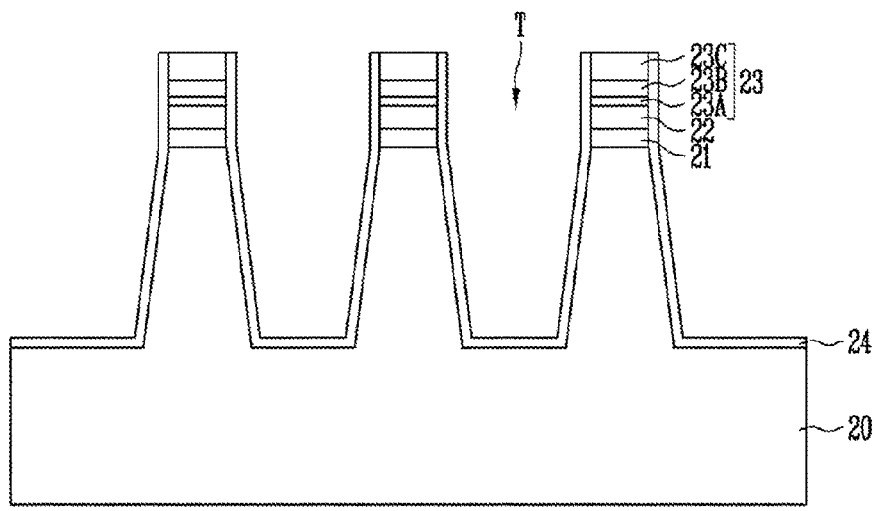
FIGS. 2A to 2K are views illustrating an example of a representation of a method of manufacturing the semiconductor device according to an embodiment of the present disclosure.

Referring to FIG. 2A, a trench T is formed in the substrate 20. For example, a process of forming the trench T includes successively forming a gate insulating layer 21, a first conductive layer 22, and a pad layer 23 on the substrate 20, and then etching the pad layer 23, the first conductive layer 22, the gate insulation layer 21, and the substrate 20. The first conductive layer 22 may be made of a conductive material such as polysilicon. The pad layer 23 may be used as an etch stop layer or a polish stop layer during a following process. The pad layer 23 may have a multilayer layer structure. For example, the pad layer 23 may include a pad oxide layer 23A, a pad nitride layer 23B, and a pad oxide layer 23C which are successively stacked.

The substrate 20 may include a plurality of memory blocks, and each memory block may include a cell region in which memory cells are stacked. Furthermore, the trench T may be an isolation trench for defining an active region.

Subsequently, a first liner layer 24 is formed in the trench T. The first liner layer 24 may be formed with a uniform thickness on an inner surface of the trench T. For instance, the first liner layer 24 may include an oxide layer formed through an oxidation process.

Figure 2B:
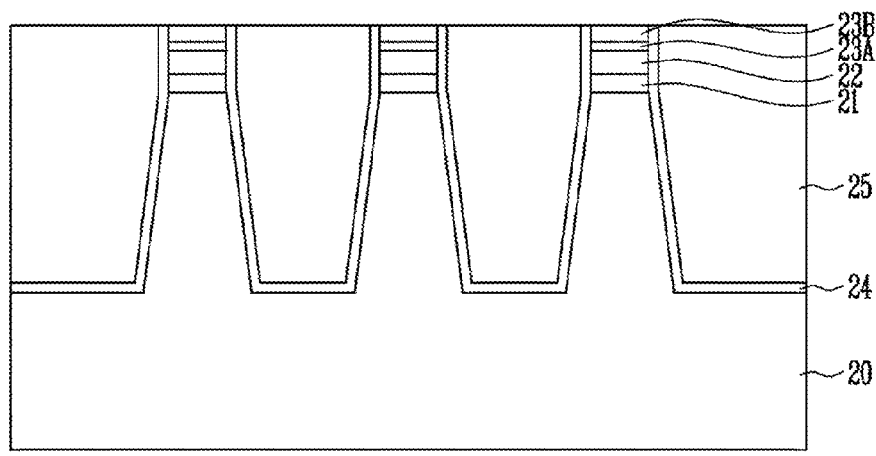

Referring to FIG. 2B, the first insulating layer 25 is formed in the trench T. For example, the first insulating layer 25 is formed over the substrate 20 such that the trench T is filled with the first insulating layer 25. Thereafter, the first insulating layer 25 is planarized until the pad nitride layer 23B is exposed. For instance, a chemical mechanical polishing (CMP) process is used to polish the first insulating layer 25. During this process, the pad nitride layer 23B is used as a polish stop layer. The first insulating layer 25 may be formed of a material or a composite material including one or more of include oxide, polysilazane (PSZ), and tetraethyl orthosilicate (TEOS).

Figure 2C:
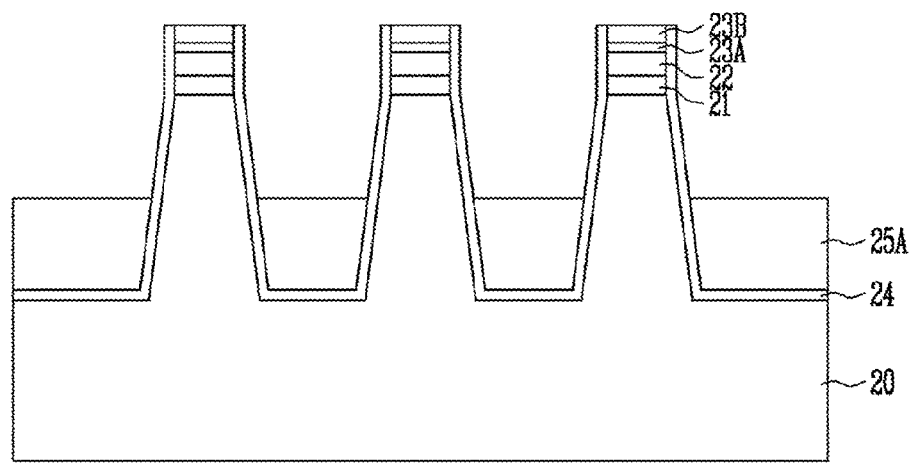

Referring to FIG. 2C, a lower insulating layer 25A is formed by removing a portion of the first insulating layer 25 in the trench T to a predetermined depth. For example, the thickness of the lower insulating layer 25A is less than half the depth of the trench T.

Figure 2D:
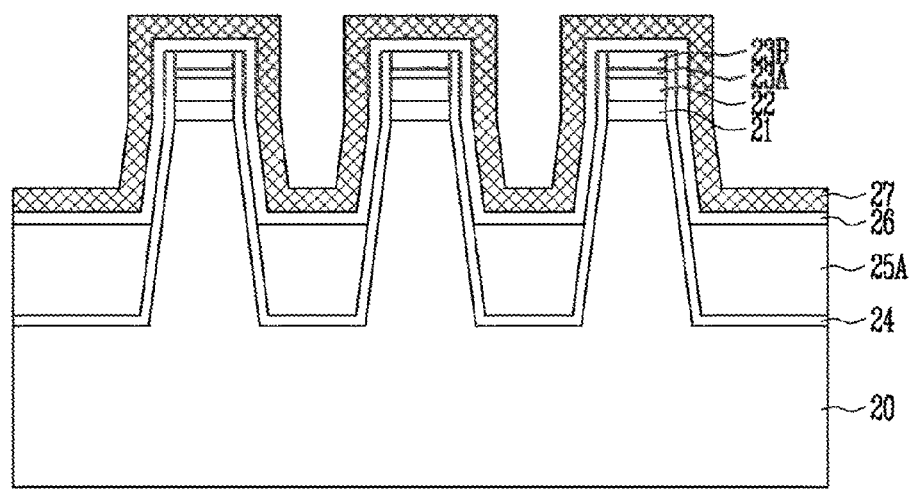

Referring to FIG. 2D, a second liner layer 26 is formed over the resultant structure in which the lower insulating layer 25A is formed. For example, the second liner layer 26 may be formed of a material or a composite material including oxide and have a uniform thickness. Thereafter, an etch stop layer 27 is formed over the second liner layer 26. The etch stop layer 27 functions to prevent a slit from extending to the substrate 20 through the trench T during a following slit forming process. The etch stop layer 27 is made of a material having a high etch selectivity with respect to the liner layer 24, the lower insulating layer 25A, and the second liner layer 26. For example, the etch stop layer 27 may be made of nitride or metal such as tungsten (W), titanium (Ti), tantalum (Ta) or the like.

Figure 2E:
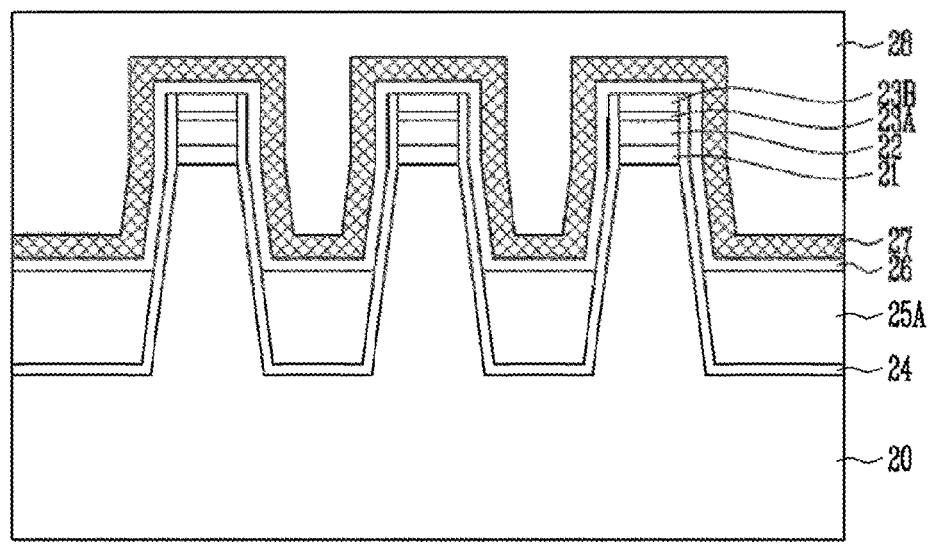

Referring to FIG. 2E, a second insulating layer 28 is formed over the resultant structure in which the etch stop layer 27 is formed and covers the trench T. For example, the second insulating layer 28 may be formed such that the trench T is filled with the second insulating layer 28. The second insulating layer 28 may be made of material having a high etch selectivity with respect to the etch stop layer 27 and include the same material as that of the lower insulating layer 25A. For example, the second insulating layer 28 may be made of a material or a composite material including one or more of oxide, polysilazane (PSZ) and tetraethyl orthosilicate (TEOS).

Figure 2F:
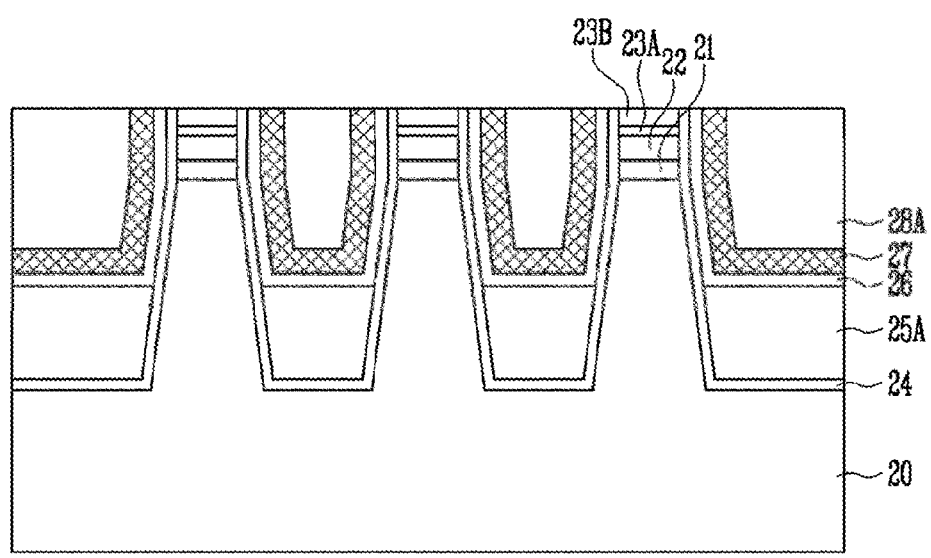

Referring to FIG. 2F, the second insulating layer 28 is planarized until the pad nitride layer 23B is exposed, and thus an upper insulating layer 28A with which an upper portion of the trench T is filled is formed. For instance, a chemical mechanical polishing (CMP) process is used to polish the second insulating layer 28. During this process, the pad nitride layer 23B is used as a polish stop layer.

Figure 2G:
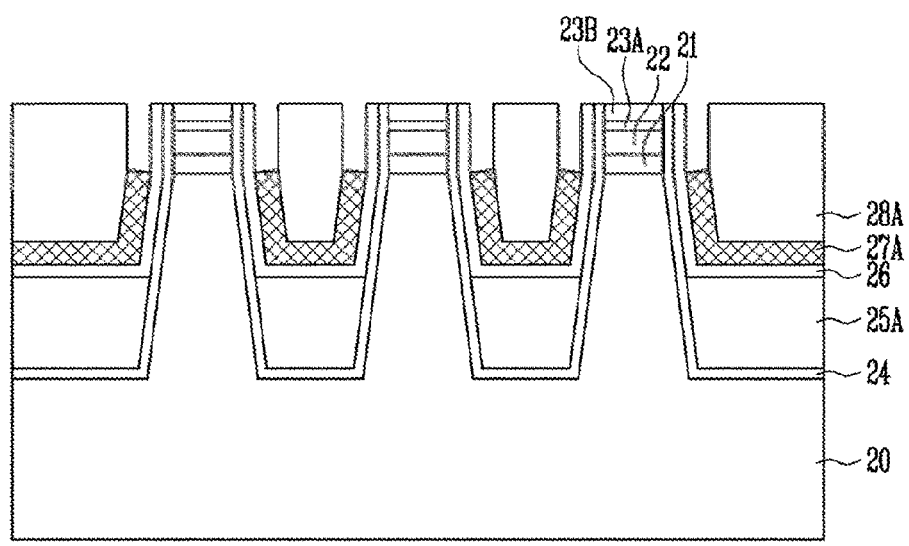

Referring to FIG. 2G, an etch stop pattern 27A is formed by removing a portion of the etch stop layer 27. For example, the etch stop pattern 27A is formed by partially removing the etch stop layer 27 such that an upper surface height of the etch stop pattern 27A is lower than an upper surface height of the upper insulating layer 28A. Therefore, the etch stop pattern 27A is interposed between the upper insulating layer 28A and the second liner layer 26 while enclosing a lower sidewall and a bottom of the upper insulating layer 28A.

Figure 2H:
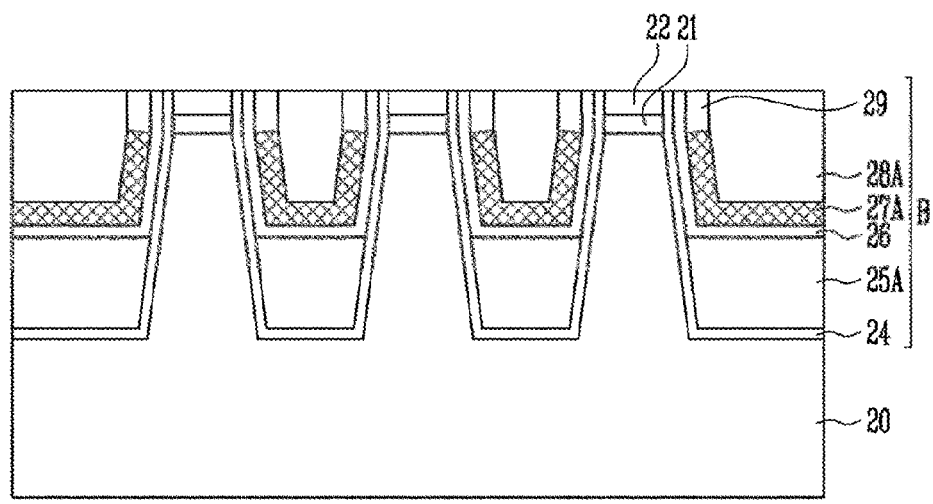

Referring to FIG. 2H, an insulating pattern 29 is formed in a region from which the etch stop layer 27 is removed. For example, a process of forming the insulating pattern 29 may including forming a third insulating layer such that the region from which the etch stop layer 27 is removed is filled with the third insulating layer, and polishing the third insulating layer until the surface of the first conductive layer 22 is exposed. Therefore, the insulating pattern 29 may surround an upper sidewall of the upper insulating layer 28A. The insulating pattern 29 may have the same or substantially the same thickness as that of the etch stop pattern 27A.

As a result of the above processes, an isolation layer B including the etch stop pattern 27A is formed in the trench T. For example, the isolation layer B includes the first liner layer 24, the lower insulating layer 25A, the second liner layer 26, the etch stop pattern 27A, the upper insulating layer 28A, and the insulating pattern 29. The isolation layer B may include only some of the above-mentioned layers.

Figure 2I:
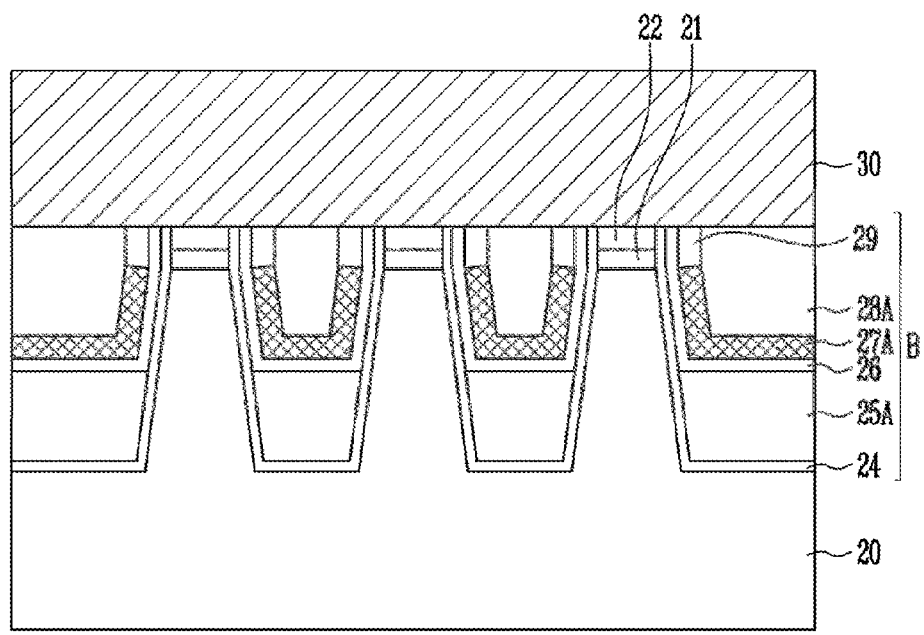

Referring to FIG. 2I, a second conductive layer 30 is formed over the substrate 20 formed with the isolation layer. The second conductive layer 30 may be a conductive layer for a pipe gate. The second conductive layer 30 may be made of a material or a composite material including polysilicon. The second conductive layer 30 may make contact with the first conductive layer 22 and be electrically connected to the first conductive layer 22. The etch stop pattern 27A is disposed in the isolation layer B, and the insulting pattern 29 is interposed between the etch stop pattern 27A and the second conductive layer 30. Therefore, the etch stop pattern 27A is in a floating state. In other words, the etch stop pattern 27A and the second conductive layer 30 are insulated from each other by the insulating pattern 29.

Figure 2J:
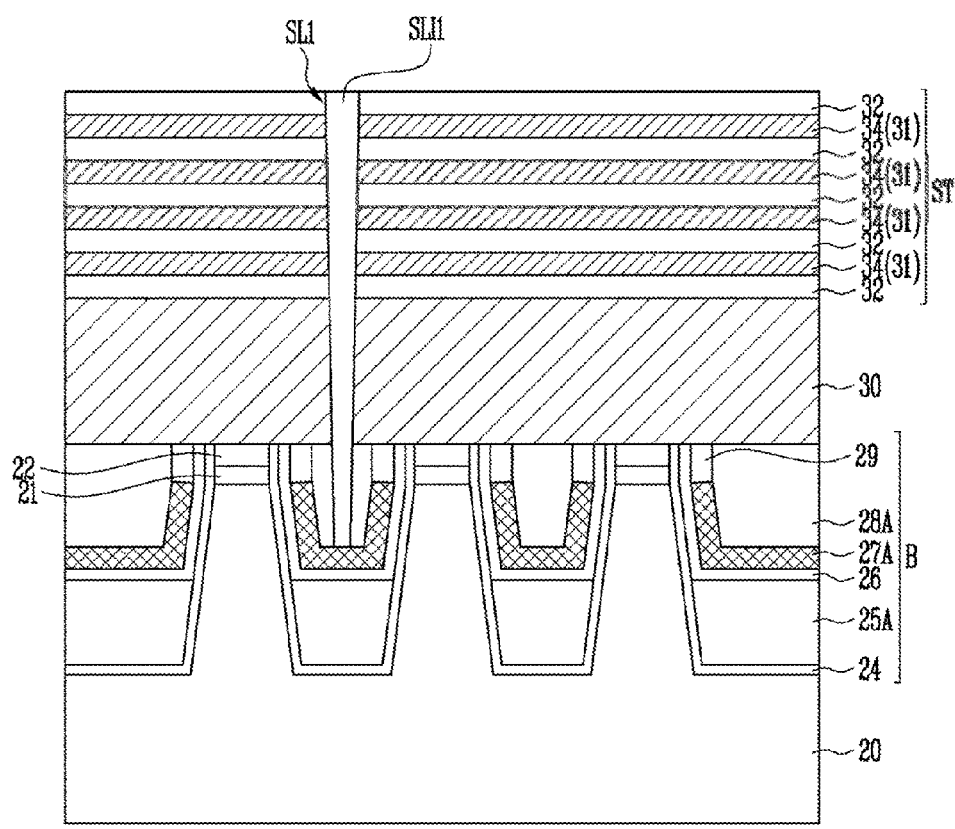

Referring to FIG. 2J, a stacked structure ST is formed over the second conductive layer 30. For example, the stacked structure may include first material layers 31 and second material layers 32 which are alternately stacked on top of one another. The first material layers 31 may be made of a material having a high etch selectivity with respect to the second material layers 32. For example, each first material layer 31 may be formed of a sacrificial layer including nitride, and each second material layer 32 may be formed of an insulating layer including oxide. Alternatively, each first material layer 31 may be formed of a conductive layer including doped polysilicon, doped amorphous silicon or the like, and each second material layer 32 may be formed of a sacrificial layer including undoped polysilicon, undoped amorphous silicon or the like. As a further alternative, each first material layer 31 may be formed of a conductive layer including doped polysilicon, doped amorphous silicon or the like, and each second material layer 32 may be formed of an insulating layer including oxide or the like. In an embodiment, each first material layer 31 is illustrated as being formed of a sacrificial layer, and each second material layer 32 is illustrated as being formed of an insulating layer.

For reference, although not shown in the drawings, before the stacked structure ST is formed, the second conductive layer 30 may be patterned in such a way that a trench is formed by etching the second conductive layer 30 and an isolation layer is formed in the trench. For example, in the case where the second conductive layer 30 is a conductive layer for a pipe gate, pipe gates are separated by the isolation layer so that each pipe gate corresponds to one of the memory blocks.

Furthermore, although not shown, after the stacked structure ST is formed, pillars which are disposed in the cell region of the memory block and pass through the stacked structure ST may be formed. The pillars may be semiconductor patterns including semiconductor materials such as silicon (Si) and germanium (Ge) and may be channel layers of a memory cell, a selection transistor, etc. Furthermore, memory layers enclosing the pillars may be formed. Each of the memory layers may include at least one of a tunnel insulating layer, a data storage layer, and a charge blocking layer, which surround the pillars. The data storage layer may be made of a material or a composite material including one or more of silicon, nitride, phase-change material, and nanodots.

Subsequently, a first slit SL1 which passes through the stacked structure ST and the second conductive layer 30 is formed, and then a first slit insulating layer SLI1 is formed in the first slit SL1. The first slit SL1 may be disposed on a boundary of the adjacent memory blocks and formed to pass through the stacked structure ST and the second conductive layer 30. Furthermore, the first slit SL1 may extend in the first direction I-I' to a predetermined depth such that the surface of the isolation layer B is exposed or the first slit SL1 passes through a portion of the isolation layer B.

Figure 2K:
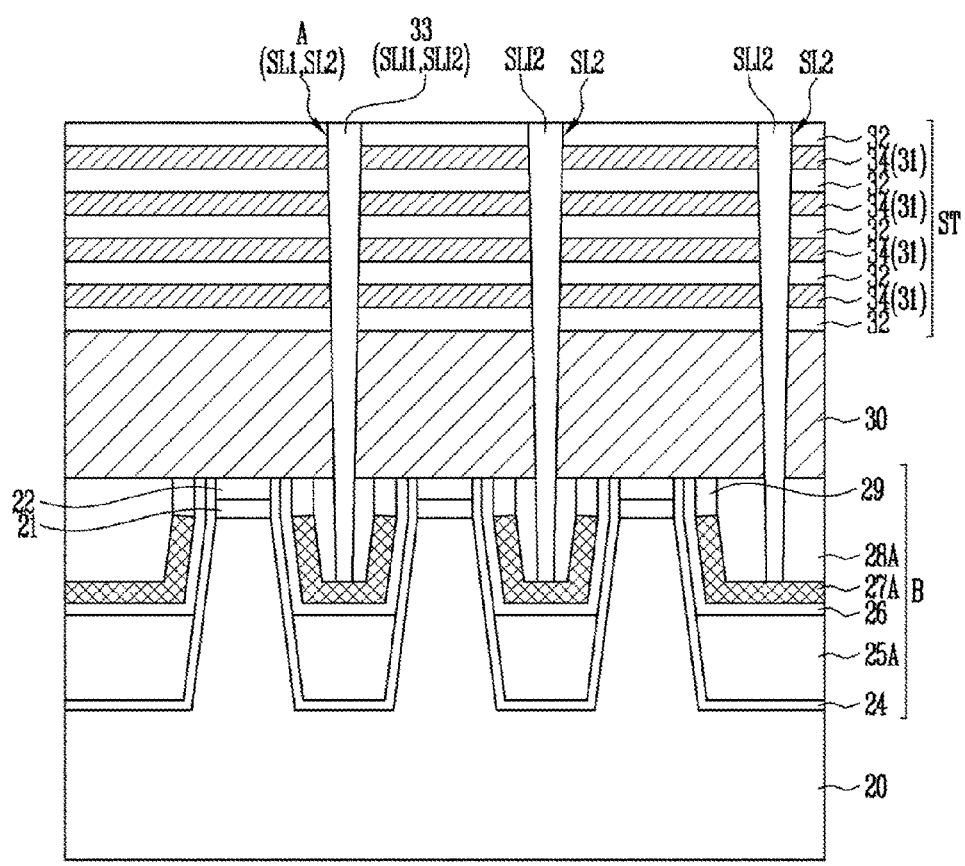

Referring to FIG. 2K, a second slit SL2 intersecting the first slit insulating layer SLI1 is formed. The second slit SL2 may extend to a predetermined depth such that it passes through the stacked structure ST and the second conductive layer 30. Furthermore, the isolation layer B may be disposed below the intersection region A. The second slit SL2 may pass through a portion of the isolation layer B in the intersection region A. Even if the second slit SL2 passes through a portion of the isolation layer B, an etching depth can be controlled by the etch stop pattern 27A formed in the isolation layer B. For example, when the second slit SL2 is formed, the stacked structure ST, the second conductive layer 30, the first slit insulating layer SLI1 and the isolation layer B are etched until the etch stop pattern 27A is exposed. Thus, the etching process for the second slit SL2 may stop at the etch stop pattern 27A and the second slit SL2 can be prevented from completely passing through the isolation layer B and extending to the substrate 20.

For reference, although the second slits SL2 are shown in FIG. 2K as being separated from each other, the second slits SL2 may be connected to each other to form a single slit. For example, the second slit SL2 may have a bent line shape in which lines extending in the first direction I-I' and lines extending in the second direction II-II' are alternately connected to each other. In addition, although the second silt SL2 is illustrated FIG. 2K as having a constant depth, the second slit SL2 in regions other than the intersection region A may have a depth less than that in the intersection region A.

Thereafter, the first material layers 31 are selectively removed through the second slit SL2 so that openings are formed between the stacked second material layers 32. Third conductive layers 34 are subsequently formed such that the openings are filled therewith. Thereafter, the third conductive layers 34 formed in the openings are separated from each other by removing the third conductive layers 34 formed in the second slit SL2. As a result of the above processes, gate electrodes of the stacked memory cells or selection transistors are formed. For reference, before the conductive layers are formed, memory layers may be formed in the openings.

Subsequently, a second slit insulating layer SLI2 is formed in the second slit SL2. As a result, a slit insulating layer 33 including a first region extending in the first direction I-I' and a second region extending in the second direction II-II' is formed. The intersection region A of the first region and the second region may pass through a portion of the isolation layer B and come into contact with the etch stop pattern 27A.

Without the etch stop pattern 27A, the second slit SL2 may completely pass through the isolation layer B in the intersection region A and extend to the substrate 20. If the second slit SL2 completely passes through the isolation layer B in the intersection region A and extends to the substrate 20, the conductive layers may be deposited on the bottom of the second slit SL2 and undesirably remain on the bottom of the second slit SL2 without being removed even during the conductive layer separation process, thus causing a bridge. However, in the embodiment of the present disclosure, the depth of the second slit SL2 can be easily controlled by the etch stop pattern 27A. Therefore, the conductive layer can be reliably prevented from remaining on the bottom of the second slit and causing a bridge.

Figure 3:
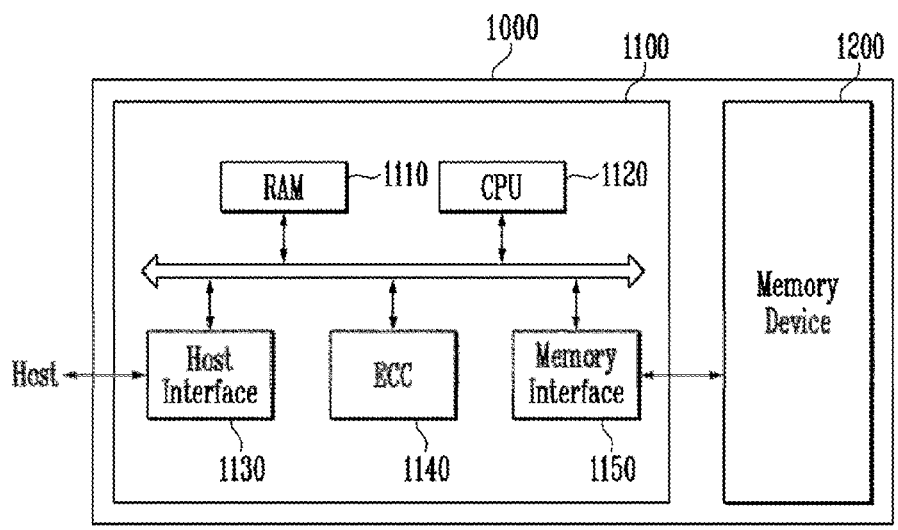
FIGS. 3 and 4 are block diagrams illustrating examples of representations of a memory system according to an embodiment of the present disclosure.

FIG. 3 is a block diagram illustrating an example of a representation of the configuration of a memory system according to an embodiment of the present disclosure.

Referring FIG. 3, the memory system 1000 according to an embodiment of the present disclosure includes a semiconductor memory device 1200 and a controller 1100.

The memory device 1200 is used to store data/information having a variety of data forms such as text, graphics, software codes, and so on. The memory device 1200 may be a nonvolatile memory and include the structure illustrated in FIGS. 1A to 2K. Furthermore, the memory device 1200 includes a substrate having a trench, an isolation layer which is formed in the trench and has an etch stop pattern therein, a stacked structure which is disposed over the substrate, and a slit insulating layer which passes through the stacked structure and has a first region extending in a first direction and a second region extending in a second direction intersecting the first direction. An intersection region of the first and second regions passes through a portion of the isolation layer and comes into contact with the etch stop pattern. The structure of the memory device 1200 and the manufacturing method thereof are the same as those described above; therefore, detailed explanation thereof will be omitted.

The controller 1100 is connected to a host and the memory device 1200 and accesses the memory device 1200 in response to a request from the host. For example, the controller 1100 controls read, write, erase, and background operations of the memory device 1200.

The controller 1100 includes random access memory (RAM) 1110, central processing unit (CPU) 1120, a host interface 1130, an error correction code (ECC) circuit 1140, a memory interface 1150, and so on.

The RAM 1110 can be used as an operation memory of the CPU 1120, a cache memory between the memory device 1200 and the host, a buffer memory between the memory device 1200 and the host, or the like. For reference, the RAM 1110 may be replaced with a static random access memory (SRAM), a read only memory (ROM), or the like.

The CPU 1120 may control overall operations of the controller 1100. For example, the CPU 1120 may operate the same firmware as that of a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The ECC circuit 1140 uses an error correction code (ECC) to detect and correct errors in data read from the memory device 1200.

The memory interface 1150 may interface with the memory device 1200. For example, the memory interface 1150 includes a NAND interface or a NOR interface.

For reference, the controller 1100 may further include a buffer memory (not shown) for temporarily storing data. The buffer memory may be used to temporarily store data to be transferred from the host interface 1130 to the outside or data to be transferred from the memory interface 1150 to the memory device 1200. The controller 1100 may further include a ROM which stores code data to interface with the host.

As such, the memory system 1000 according to an embodiment of the present disclosure includes the memory device 1200 which has a highly-integrated, stable structure. Therefore, an integration density of the memory system 1000 can also be enhanced.

Figure 4:
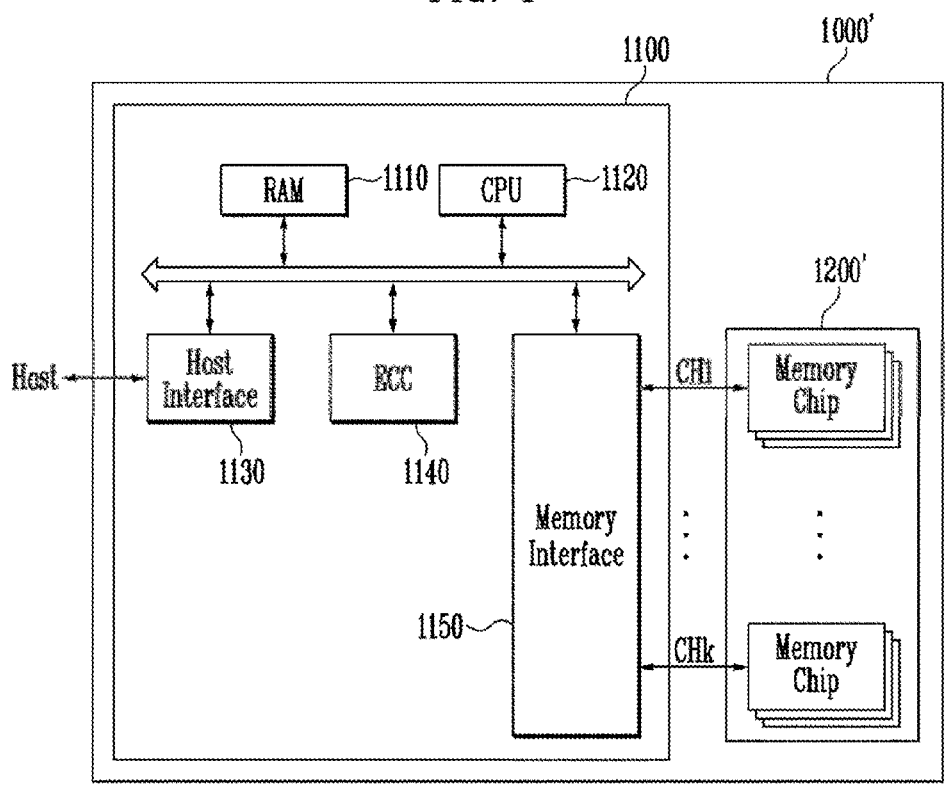

FIG. 4 is a block diagram illustrating an example of a representation of the configuration of a memory system according to an embodiment of the present disclosure. Hereinbelow, repeated explanations will be omitted.

Referring FIG. 4, the memory system 1000 according to an embodiment of the present disclosure includes a memory device 1200' and a controller 1100. The controller 1100 includes a RAM 1110, a CPU 120, a host interface 1130, an ECC circuit 1140, a memory interface 1150, and so on.

The memory device 1200 may be a nonvolatile memory and include the memory string illustrated with reference to FIGS. 1A to 2K. Furthermore, the memory device 1200' includes a substrate having a trench, an isolation layer which is formed in the trench and has an etch stop pattern therein, a stacked structure which is disposed over the substrate, and a slit insulating layer which passes through the stacked structure and has a first region extending in a first direction and a second region extending in a second direction intersecting the first direction. An intersection region of the first and second regions passes through a portion of the isolation layer and comes into contact with the etch stop pattern. The structure of the memory device 1200' and the manufacturing method thereof are the same as those described above; therefore detailed explanation thereof will be omitted.

Furthermore, the memory device 1200' may be a multi-chip package including a plurality of memory chips. The plurality of memory chips are divided into a plurality of groups. The plurality of groups may communicate with the controller 1100 through first to k$^{th}$ channels CH1 to CHk. The memory chips of each group communicate with the controller 1100 through a common channel. The memory system 1000' may be modified such that each single memory chip is connected to a corresponding single channel.

As such, the memory system 1000' according to an embodiment of the present disclosure includes the memory device 1200' which has a highly-integrated, stable structure. Therefore, an integration density of the memory system 1000' can also be enhanced. In addition, the memory device 1200' according to an embodiment is formed of a multi-chip package that may improve the data storage capacity and the operating speed.

Figure 5:
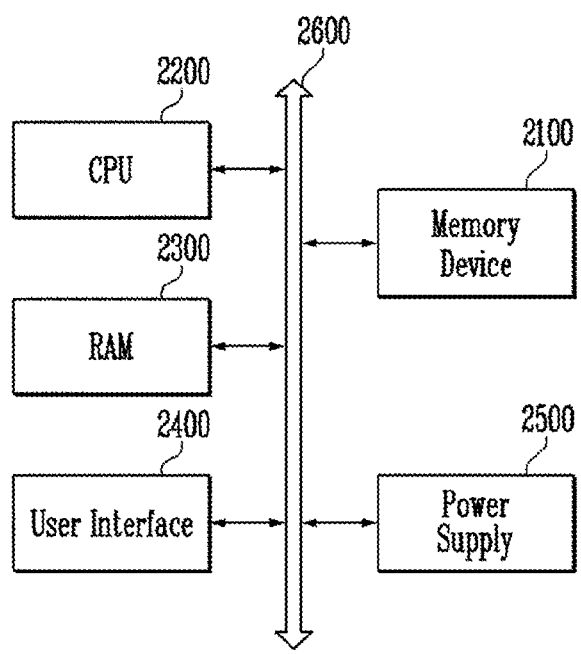
FIGS. 5 and 6 are block diagrams showing illustrating representations of examples of a computing system according to an embodiment of the present disclosure.

FIG. 5 is a block diagram illustrating an example of a representation of the configuration of a computing system according to an embodiment of the present disclosure. Hereinbelow, repeated explanations will be omitted.

As shown in FIG. 5, the computing system 2000 according to an embodiment of the present disclosure includes a memory device 2100, a CPU 2200, a RAM 2300, a user interface 2400, a power supply 2500, a system bus 2600, and so on.

The memory device 2100 stores data provided via the user interface 2400, data processed by the CPU 2200, etc. Furthermore, the memory device 2100 is electrically connected to the CPU 2200, the RAM 2300, the user interface 2400, the power supply 2500, etc., by the system bus 2600. For example, the memory device 2100 may be connected to the system bus 2600 via a controller (not shown) or, alternatively, directly connected to the system bus 2600. In the case where the memory device 2100 is directly connected to the system bus 2600, the function of the controller may be performed by the CPU 2200, the RAM 2300, etc.

The memory device 2100 may be a nonvolatile memory and include the memory string illustrated with reference to FIGS. 1A to 2K. Furthermore, the memory device 2100 includes a substrate having a trench, an isolation layer which is formed in the trench and has an etch stop pattern therein, a stacked structure which is disposed over the substrate, and a slit insulating layer which passes through the stacked structure and has a first region extending in a first direction and a second region extending in a second direction intersecting the first direction. An intersection region of the first and second regions passes through a portion of the isolation layer and comes into contact with the etch stop pattern. The structure of the memory device 2100 and the manufacturing method thereof are the same as those described above; therefore detailed explanation thereof will be omitted.

Furthermore, the memory device 2100 may be a multi-chip package including a plurality of memory chips, as illustrated with reference to FIG. 4.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As such, the computing system 2000 according to an embodiment of the present disclosure includes the memory device 2100 which has a highly-integrated, stable structure. Therefore, the data storage capacity of the computing system 2000 can be enhanced.

Figure 6:
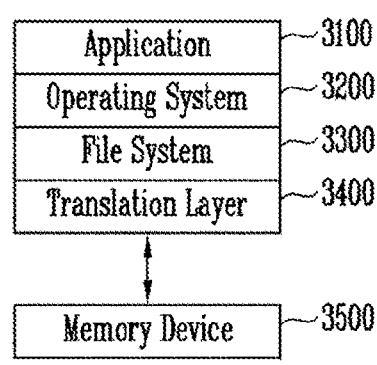

FIG. 6 is a block diagram illustrating a representation of an example of a computing system according to an embodiment of the present disclosure.

As illustrated in FIG. 6, the computing system 3000 according to an embodiment of the present disclosure has a software layer including an operating system 3200, an application 3100, a file system 3300, a translation layer 3400, and so on. Furthermore, the computing system 300 includes a hardware layer such as a memory device 3500.

The operating system 3200 manages software resources and hardware resources, etc., of the computing system 3000 and may control program execution by the CPU. The application 3100 may include various application programs executed in the computing system 3000 and may be a utility executed by the operating system 3200.

The file system 3300 refers to a logical structure to control data, files, etc., of the computing system 3000 and organizes files or data to be stored in the memory device 3500 or the like according to a given rule. The file system 3300 is determined depending on the operating system 3200 used in the computing system 3000. For example, if the operating system 3200 is Microsoft's Windows system, the file system 3300 may be a file allocation table (FAT), an NT file system (NTFS), or the like. If the operating system 3200 is a Unix/Linux system, the file system 3300 may be an extended file system (EXT), a Unix file system (UFS), a journaling file system (JFS), or the like.

Although the operating system 3200, the application 3100 and the file system 3300 are expressed as separate blocks in the drawing, the application 3100 and the file system 3300 may be included in the operating system 3200.

The translation layer 3400 translates an address into a suitable form for the memory device 3500 in response to a request from the file system 3300. For example, the translation layer 3400 translates a logical address produced by the file system 3300 into a physical address of the memory device 3500. Mapping information of the logical address and physical address may be stored in an address translation table. For example, the translation layer 3400 may be a flash translation layer (FTL), a universal flash storage link layer (ULL), or the like.

The memory device 3500 may be a nonvolatile memory and include the memory string illustrated in FIGS. 1A to 2K. Furthermore, the memory device 3500 includes a substrate having a trench, an isolation layer which is formed in the trench and has an etch stop pattern therein, a stacked structure which is disposed over the substrate, and a slit insulating layer which passes through the stacked structure and has a first region extending in a first direction and a second region extending in a second direction intersecting the first direction. An intersection region of the first and second regions passes through a portion of the isolation layer and comes into contact with the etch stop pattern. The structure of the memory device 3500 and the manufacturing method thereof are the same as those described above; therefore detailed explanation thereof will be omitted.

The computing system 300 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 2000. The translation layer 3400 may be included in the operating system layer or the controller layer.

As such, the computing system 3000 according to an embodiment of the present disclosure includes the memory device 3500 which has a highly-integrated, stable structure. Therefore, the data storage capacity of the computing system 3000 can be enhanced. As described above, in various embodiments of the present disclosure, an isolation layer includes an etch stop pattern. A portion of the slit insulating layer may pass through a portion of the isolation layer and come into contact with the etch stop pattern. Therefore, the slit insulating layer can be prevented from completely passing through the isolation layer and extending to a substrate. Furthermore, a bridge can be prevented from being formed between the substrate and stacked conductive layers.

While the spirit and scope of the present disclosure is described by detailed exemplary embodiments, it should be noted that the above-described embodiments are merely descriptive and should not be considered limiting. Further, it should be understood by those skilled in the art that various changes, substitutions, and alternations may be made herein without departing from the scope of the disclosure as defined by the following claims.

What is claimed is:

1. A semiconductor device comprising:
   a substrate including a trench;
   an isolation layer formed in the trench and including an etch stop pattern;
   a stacked structure disposed over the substrate; and
   a slit insulating layer passing through the stacked structure and including a first region extending in a first direction and a second region extending in a second direction intersecting with the first direction, wherein an intersection region between the first region and the second region passes through a portion of the isolation layer and comes into contact with the etch stop pattern.

2. The semiconductor device according to claim 1, wherein the isolation layer comprise:
   a first insulating layer filling a lower portion of the trench;
   a second insulating layer filling an upper portion of the trench; and
   the etch stop pattern interposed between the first insulating layer and the second insulating layer.

3. The semiconductor device according to claim 1, wherein the isolation layer comprises:
   a first liner layer formed over an inner surface of the trench;
   a first insulating layer formed in the first liner layer and filling a lower portion of the trench;
   a second insulating layer formed in the first liner layer and filling an upper portion of the trench;
   the etch stop pattern interposed between the first insulating layer and the second insulating layer and surrounding a lower sidewall of the second insulating layer; and
   an insulating pattern surrounding an upper sidewall of the second insulating layer.

4. The semiconductor device according to claim 3, wherein the etch stop pattern and the insulating pattern have the same or substantially the same thickness as one another.

5. The semiconductor device according to claim 3, wherein the isolation layer comprises a second liner layer interposed between the first liner layer and the insulating pattern, between the first liner layer and the etch stop pattern, and between the first insulating layer and the etch stop pattern.

6. The semiconductor device according to claim 1, wherein the stacked structure comprises:
   conductive layers and insulating layers alternately stacked on top of one another; and
   semiconductor patterns passing through the stack.

7. The semiconductor device according to claim 1, wherein the etch stop pattern is made of a material or a composite material including one or more of silicon, nitride, titanium, tantalum or tungsten.

8. A semiconductor device comprising:
   a substrate;
   an isolation layer formed in the substrate and including an etch stop pattern therein;
   gate electrodes stacked on the substrate;
   a first slit insulating layer passing through the gate electrodes; and
   a second slit insulating layer passing through the gate electrodes and intersecting with the first slit insulating layer on the isolation layer.

9. The semiconductor device according to claim 8, wherein the second slit insulating layer passes through a portion of the isolation layer on which the first and second slit insulating layers intersect and comes into contact with the etch stop pattern.

10. The semiconductor device according to claim 8, wherein a plurality of memory blocks are defined on the substrate, and wherein each of the memory blocks includes a cell region in which memory cells are stacked, and the first slit insulating layer is disposed in a boundary between the adjacent memory blocks.

11. The semiconductor device according to claim 8, wherein a plurality of memory blocks are defined on the substrate, and wherein each of the memory blocks includes a cell region in which memory cells are stacked, and the second slit insulating layer is disposed in the cell region.

* * * * *